(12) United States Patent
Yang et al.

(10) Patent No.: US 11,004,524 B2
(45) Date of Patent: May 11, 2021

(54) SSD HAVING A PARALLELIZED, MULTI-LEVEL PROGRAM VOLTAGE VERIFICATION

(71) Applicant: Intel Corporation, Santa Clara, CA (US)

(72) Inventors: Xiang Yang, Santa Clara, CA (US); Shantanu R. Rajwade, Santa Clara, CA (US); Ali Khakifirooz, Los Altos, CA (US); Tarek Ahmed Ameen Beshari, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 42 days.

(21) Appl. No.: 16/591,978

(22) Filed: Oct. 3, 2019

(65) Prior Publication Data

US 2021/0104285 A1 Apr. 8, 2021

(51) Int. Cl.
*G11C 11/00* (2006.01)
*G11C 16/34* (2006.01)
*G11C 16/08* (2006.01)

(52) U.S. Cl.
CPC .......... *G11C 16/3459* (2013.01); *G11C 16/08* (2013.01)

(58) Field of Classification Search
CPC . G11C 16/0483; G11C 16/10; G11C 16/3459; G11C 11/5628; G11C 16/26; G11C 11/5642; G11C 16/08; G11C 16/24; G11C 16/3454; G11C 29/021; G11C 16/32; G11C 16/14; G11C 16/12; G11C 16/16; G11C 16/34; G11C 11/5635
See application file for complete search history.

(56) References Cited

U.S. PATENT DOCUMENTS

| 2013/0094294 A1* | 4/2013 | Kwak ..................... G11C 16/08 365/185.03 |
| 2016/0118135 A1* | 4/2016 | Dutta .................. G11C 11/5642 365/185.03 |
| 2016/0343450 A1* | 11/2016 | Lee .................... H01L 27/11556 |
| 2018/0374545 A1* | 12/2018 | Hong ..................... G11C 16/26 |

* cited by examiner

*Primary Examiner* — Hien N Nguyen
(74) *Attorney, Agent, or Firm* — Compass IP Law PC

(57) ABSTRACT

An apparatus is described. The apparatus includes a storage device controller having logic circuitry to apply a program voltage verification process for a first threshold level to a group of non volatile memory cells and correlate first program voltages for the group of non volatile memory cells determined from the process to a second threshold level to determine second program voltages for the second threshold level for the group of non volatile memory cells. The second threshold level is higher than the first threshold level.

20 Claims, 6 Drawing Sheets

SSD HAVING A PARALLELIZED, MULTI-LEVEL PROGRAM VOLTAGE VERIFICATION

FIELD OF INVENTION

The field of invention pertains generally to the computing sciences, and, more specifically to an SSD having a parallelized, multi-level program voltage verification.

BACKGROUND

With the onset of "big-data", artificial intelligence, machine learning and other highly data intensive applications, the ability to access stored data is becoming an increasingly important aspect of modern data computing systems and data centers. As such, developers of mass storage devices, such as Solid State Drives (SSDs), are focused on improving the density and speed of their devices.

FIGURES

A better understanding of the present invention can be obtained from the following detailed description in conjunction with the following drawings, in which.

DETAILED DESCRIPTION

Figure 1:
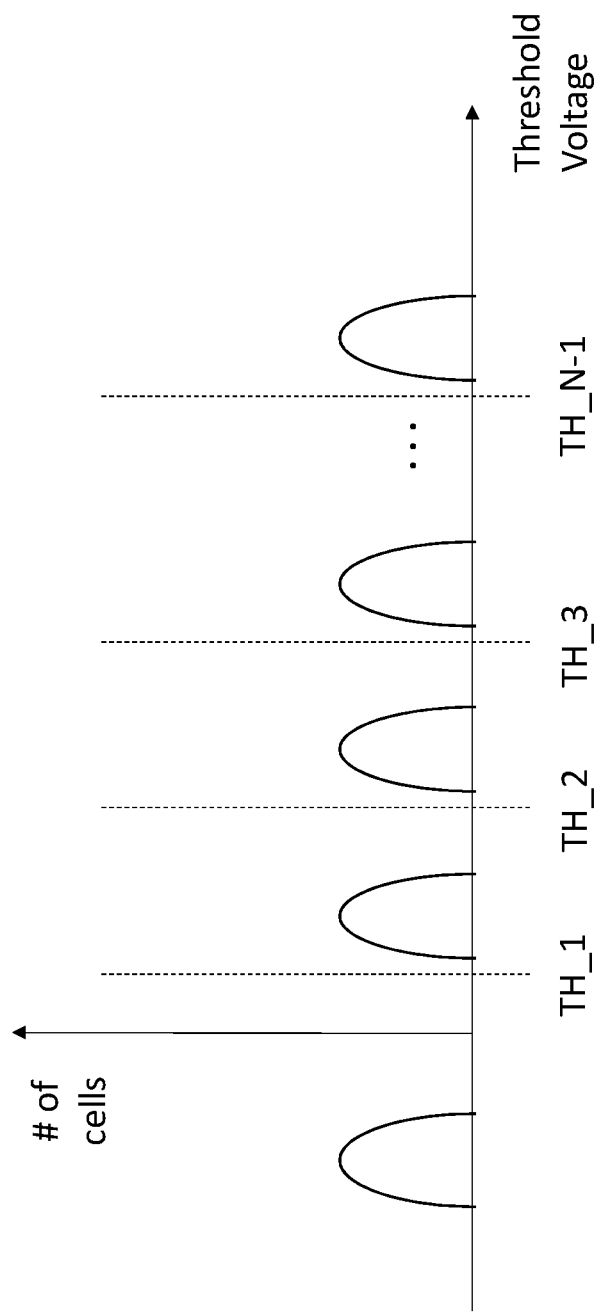
FIG. 1 illustrates different threshold levels of a flash memory.

FIG. 1 shows stored charge distributions for different charge or "threshold" levels of a flash memory cell. Here, as is known in the art, the development of flash memory is largely characterized by advances in "multi-level" cell technology. Multi-level flash cells are designed to store more than one bit of information. For example, a "triple-level cell" (TLC) is designed to store three bits of information, a "quad-level cell" (QLC) is designed to store four bits of information. In the case of a TLC flash cell, the flash cell is designed to discretely store eight different charge or "threshold" levels (N=8 in FIG. 1). In the case of a QLC flash cell, the flash cell is designed to discretely store sixteen different threshold levels (N=16 in FIG. 1).

Here, storing more bits per cell corresponds to increased storage capacity per cell and increased overall SSD storage capacity. According to traditional SSD operation, however, an SSD's storage cells are initially configured at lower/lowest storage densities. For example, initially, all cells in an SSD may be configured to operate as a single level cell (one stored bit per cell) or a multi-level cell (two stored bits per cell). Over the course of the SSD's operation the amount of data stored by the SSD increases which triggers the reconfiguring of various cells to higher densities (more bits stored per cell).

To increase a cell's storage density to a next higher threshold level, the appropriate program voltage for the higher threshold level needs to be determined (a program voltage is the voltage placed on the word line of a cell to set the cell's stored charge to a particular threshold level). Due to manufacturing tolerances, etc., the appropriate program voltage for a particular threshold level varies from cell to cell. More specifically, for any particular threshold level, some (weaker) cells will need a higher program voltage to keep sufficient charge for the higher threshold level, while, other (stronger) cells only need a lower program voltage to keep sufficient charge for the higher threshold level.

As such, the process of determining the appropriate program voltage for a group of cells that are to collectively have their densities increased to a same, higher threshold level entails individually determining which cells are stronger and which cells are weaker, and, establishing lesser program voltages for the stronger cells and higher program voltages for the weaker cells.

Additionally, generally, cell densities are not uniform over the SSD. Some cells can be more frequently targeted with new write information than other cells resulting in their densities being increased to higher threshold levels before other cells that are less frequently targeted with new write information.

As such, the circumstance often arises when two groups of different cells need to have their densities increased to two different, higher threshold levels. That is, for instance, a first group of cells that are currently operating up to an L5 level will need to have their densities increased to an L6 level, and, a second group of cells that are also currently operating up to an level will need to be have their densities increased to an L7 level. The SSD controller is then responsible for executing a routine that will establish appropriate L6 program voltages for the L5 cells and establish appropriate L7 program voltages for the L6 cells.

Figure 2:
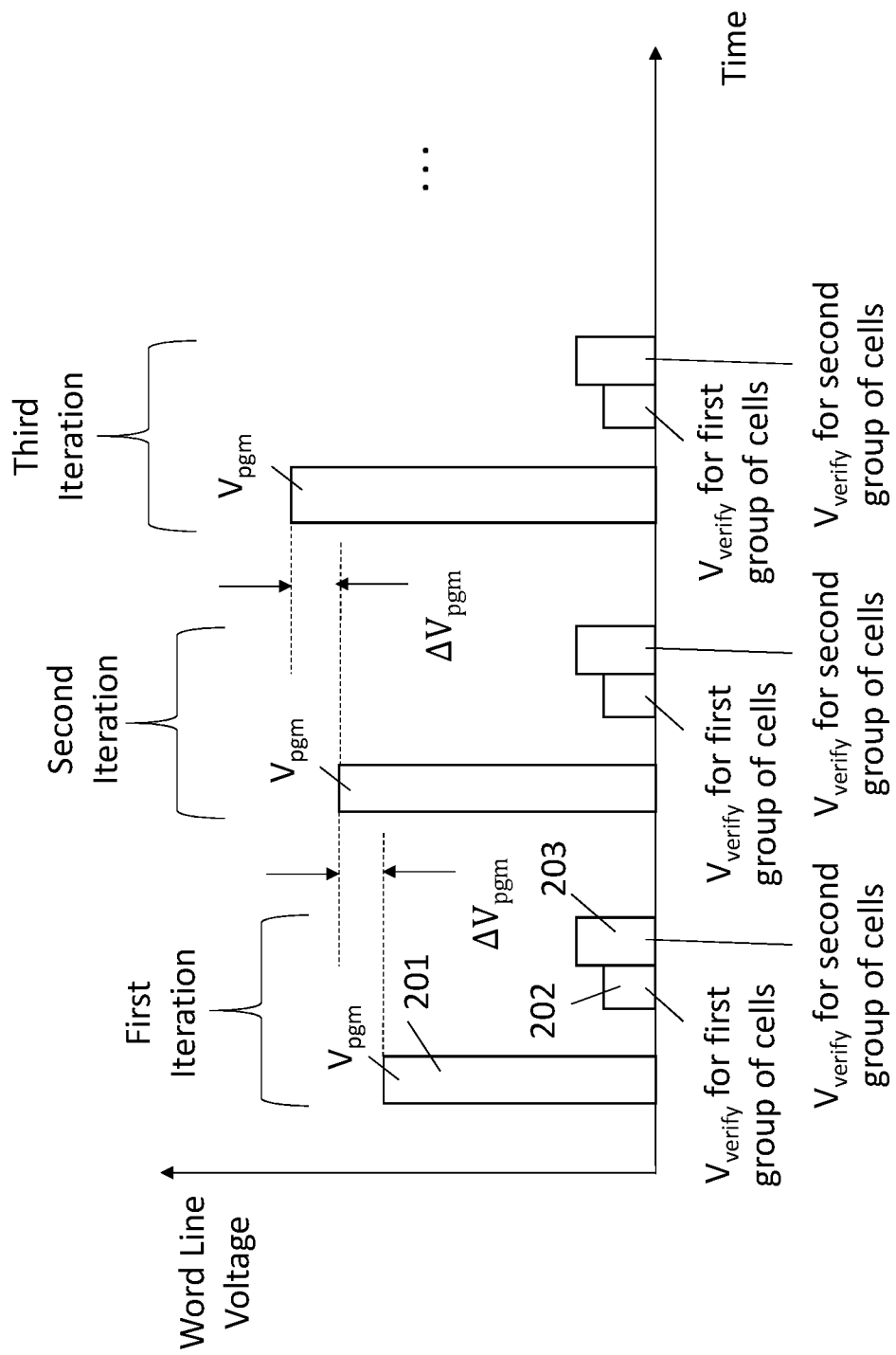
FIG. 2 shows a traditional program-verify process.

FIG. 2 shows a traditional approach for increasing the cell density of two groups of cells to two different, higher threshold levels. That is, FIG. 2 is directed to a situation where a first group of cells need to have their respective program voltages determined for a first higher threshold level (e.g., L6), and, a second group of cells need to have their respective program voltages determined for a second higher threshold level (e.g., L7), where, the second level has a higher threshold than the first level.

As will become clear in the following description, the traditional approach applies an iterative "program-verify" process. According to the program-verify approach, a program voltage 201 is first applied to both groups of cells. Cells from the first group are then independently verified 202 followed by verification 203 of cells from the second group. The program-verify process is repeated until all cells are verified. Importantly, as will be made more clear in the following discussion, the traditional approach of FIG. 2 requires different word line voltages 202, 203 (and threshold test voltages) for the first and second threshold level verifications. As a consequence, cells from the first group must be verified separately and in isolation from the cells in the second group and vice-versa.

Referring to FIG. 2, during a first iteration, the columns or bit lines of cells from both groups are biased so that their respective cells will store charge in response to a program voltage. A large initial program voltage 201 (e.g., 19 V) is applied to the word lines of the cells of both groups. The cells from the first group are then verified 202. The verification process entails applying a first word line voltage to cells of the first group and individually testing these cells to determine which cells store sufficient charge for the first higher threshold level. Those cells from the first group that store sufficient charge for the first, higher threshold level are marked as "pass" while those that do not are marked as "fail".

The cells from the second group are then verified 203. This verification process entails applying a second word line voltage to cells of the second group and individually testing these cells to determine which cells store sufficient charge for the second higher threshold level. The cells from the second group that store sufficient charge for the second, higher level are marked as "pass" while those that do not are marked as "fail".

Notably, the word line voltage 203 used for the verification of the second group of cells is higher than the word line voltage 202 used for the verification of the second group of cells (higher threshold levels require higher access voltages). Moreover, the amount of stored charge or detected voltage from each cell that qualifies as a pass is different for the first and second groups of cells (the second group of cells needing to establish more charge for a pass than the first group).

The sequence then advances to the next (second) program-verify iteration. Here, the program voltage is increased by some fixed increment ($\Delta Vpgm$) and applied to all the cells marked as fail. The cells that are marked as pass are isolated ("inhibited") from the application of the second program voltage by applying to their respective columns/bitlines a bias voltage (e.g., VCC or ~2.5V) that prevents the cells from storing charge in response to the second program voltage. The program voltage is then applied on the failed cells' respective word lines (because a single word line is coupled to many columns of cells, columns are inhibited or not-inhibited on a column by column basis).

The process then repeats with the non-inhibited cells from the first group being verified in isolation of the second group of cells. That is, the non-inhibited cells from the first group are checked to see which ones store sufficient charge for the first, higher threshold level (presumably, the higher program voltage of the second iteration caused some of the previously failing cells to become passing cells). Again, cells from the first group that store sufficient charge for the first, higher threshold level are marked as pass and will be inhibited for the next iteration. Those cells from the first group that still do not store sufficient charge for the first, higher threshold level are marked as fail and will not be inhibited for the next iteration (they will receive a next incrementally higher program voltage).

The non-inhibited cells from the second group are then checked to see which ones store sufficient charge for the second, higher threshold level (presumably, the higher program voltage of the second iteration caused some of the previously failing cells to become passing cells). Again, cells from the second group that store sufficient charge for the second, higher level are marked as pass and will be inhibited for the next iteration. Those cells from the second group that still do not store sufficient charge for the second, higher threshold level are marked as fail and will not be inhibited for the next iteration (they will receive a next incrementally higher program voltage).

The process then repeats with the respective program voltage of each successive iteration being one increment higher than the previous iteration until all cells from both groups pass.

A problem is the amount of time consumed separately verifying the first and second groups of cells, including the application of different word line and test voltages to the different groups of cells during their respective verifications. Here, with cells from both groups being independently verified, the verification process is essentially serial with the amount of time consumed being linear with the total number of cells in both groups.

Figure 3:
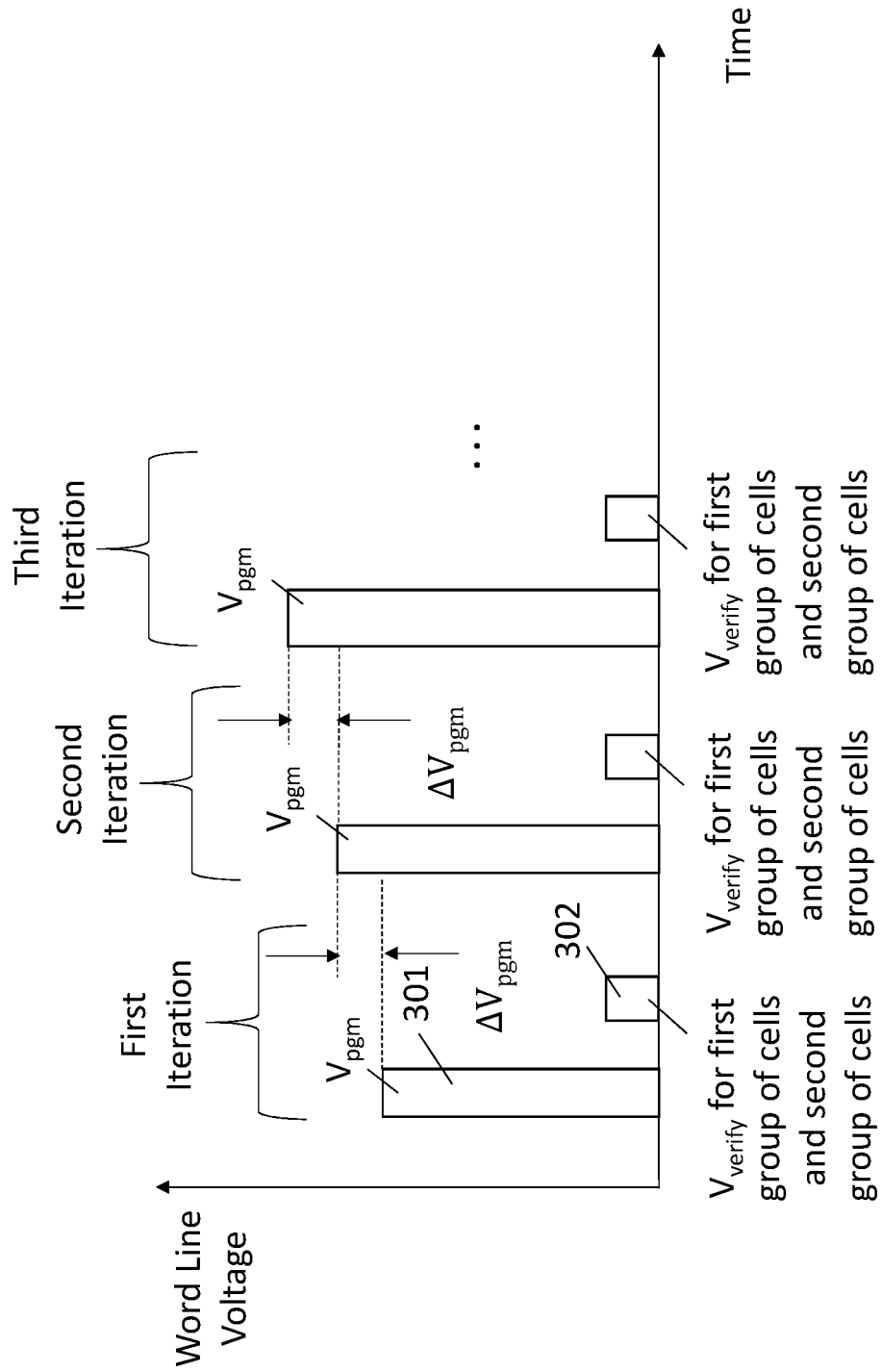
FIG. 3 shows an improved program-verify process.

FIG. 3 shows an improved approach that introduces parallelism into the program-verify process of FIG. 2. In particular, as will be explained further below, both groups of cells are verified with the verification process used for the first threshold level. That is, continuing with an example where a first group of L5 cells are being verified for the L6 level and a second group of L5 cells are being verified for the L7 level, in the improved process, cells from both groups are verified for the L6 level. A correlation is then used to determine the appropriate program level for the cells of the second group (that are to store data up to the L7 level).

With this approach, only a single verification word line voltage and threshold comparison need be applied to all cells from both groups (that of the first threshold level). Verification of cells from the first group essentially follow the traditional algorithm. However, cells from the second group will be verified with the same word line voltage and threshold comparison used to verify the cells in the first group. When a cell in the second group is deemed to have stored enough charge to pass the first, higher threshold level (even though these cells are to be configured for the second, higher threshold level), an appropriate program voltage is determined for that cell based on a correlation to the program voltage that was applied during the iteration in which the cell passed its first level verification.

The ability to determine appropriate program voltages for different, higher threshold levels from a same verification process introduces parallelism into the overall verification across all levels. More specifically, the tear-down and setup of different word line voltages, including specially applying a first word line voltage to a first group of cells and then specially applying a second word line voltage to a second group of cells, is avoided. Likewise, the tear-down and setup of different threshold comparisons, specifically, a comparison against a first threshold for the first group of cells and a comparison against a second threshold for the second group of cells is also avoided.

Referring to FIG. 3, during a first iteration, the columns or bit lines of cells from both groups are biased so that their respective cells will store charge in response to a program voltage. A large initial program voltage 301 (e.g., 19V) is applied to the word lines of the cells from both groups. The cells from the first group are then verified against the threshold of the first level 302. This verification process entails applying a first word line voltage to cells of the first group and individually testing these cells to determine which cells store sufficient charge for the first higher threshold level. Those cells from the first group that store sufficient charge for the first, higher threshold level are marked as "pass" while those that do not are marked as "fail".

The cells from the second group are then also "verified" against the threshold of the first level 302 concurrently. This verification process entails applying the same word line voltage that was applied to the cells of the first group to the cells of the second group and individually testing the cells of the second group against the same (first) threshold as the first group of cells to determine which cells of the second group store sufficient charge for the first, higher threshold level. The cells from the second group that store sufficient charge for the first, higher level are marked as "pass" while those that do not are marked as "fail".

Because the same verification process 302 is used for verification of both groups of cells, the second group of cells are essentially verified concurrently with the first group of cells rather than as a separate, isolated verification process.

The sequence then advances to the next (second) program-verify iteration. Here, the program voltage is increased by some fixed increment (ΔVpgm) and applied to all the cells marked as fail. The cells that are marked as pass are isolated ("inhibited") from the application of the second program voltage by applying to their respective columns/bitlines a bias voltage (e.g., VCC, or ~2.5V) that prevents the cells from storing charge in response to the second program voltage. The incremented program voltage is applied on the failed cells' respective word lines.

The process then repeats with the non-inhibited cells from the first group being verified together with the second group of cells. That is, e.g., a same word line voltage and threshold comparison is applied to cells from both groups. The non-inhibited cells from the first group that store sufficient charge for the first, higher threshold level are marked as pass and will be inhibited for the next iteration. Those cells from the first group that still do not store sufficient charge for the first, higher threshold level are marked as fail and will not be inhibited for the next iteration (they will receive a next incrementally higher program voltage).

Likewise, the non-inhibited cells from the second group are checked to see which ones store sufficient charge for the first, higher threshold level. Those cells from the second group that store sufficient charge for the first, higher level are marked as "pre-pass" and will not immediately be inhibited for the next iteration. Instead, they are allowed to receive a predetermined one or more extra program pulses (or a "bump up" that is elaborated further below) until they are formally marked as "pass". Those cells from the second group that still do not store sufficient charge for the first, higher threshold level are marked as fail and will not be inhibited for the next iteration (they will receive a next incrementally higher program voltage as per normal process).

The process then repeats with the respective program voltage of each successive iteration being one increment higher than the previous iteration until all cells from both groups pass.

As alluded to above, a correlation is used to determine the appropriate program voltage for cells of the second group based on the program voltage of the specific iteration that was applied to each cell of the second group just prior to the cell's being deemed a pass. In an embodiment, the correlation entails adding a program voltage offset or "bump up" from the specific program voltage that a cell in the second group was deemed to have passed the first threshold level at. For example, if a cell in the second group is deemed to have passed the first level at $V_1$, the appropriate program voltage for the cell at the higher, second level is calculated as $V_2 = V_1 + V_k$ where $V_k$ is a constant.

In an embodiment, the $V_k$ bump-up translates into one or more extra pumps of charge on the word line than what was applied to the cell during the iteration it was deemed to have passed the first level. Here, as is understood in the art, SSDs include charge pump circuits to generate the high program voltages. The charge pump circuit pumps an amount of charge onto a word line with each cycle, and, with each such cycle, the program voltage that is applied to the word line increases. Thus, a fixed bump-up in program voltage corresponds to an extra number of pump cycles performed by the charge pump circuit for cells of the second group.

In still other embodiments some correlation other than a fixed bump-up across all cells of the second group is established. Here, the improved program-verify process of FIG. 3 essentially distinguishes stronger cells from weaker cells in the second group based on a verification process for the first level (stronger cells will pass on iterations before weaker cells). In some embodiments, additional bump-up increments are applied to cells as they become weaker. For example, a single bump-up may be applied to the strongest cells of the second group, while, two or three (or more) bump-ups may be applied to the weakest cells of the second group (with medium strength cells receiving an in-between amount of bump-ups).

In still yet other embodiments, rather than setting bump-ups as one or more fixed size increments, instead, a more explicit bump-up amount is calculated from a continuous function (e.g., which varies as a quadratic) and the correct number of additional charge pump pulses is calculated for the calculated bump-up amount.

Although the discussion above has emphasized only two groups of cells whose respective program voltages are being concurrently determined for only two different, higher threshold levels, in other embodiments, more than two groups of cells may have their program voltages determined from the approach of FIG. 3 described above.

For example, if a third group of cells are to have their program voltages determined for a third, higher voltage level (e.g., a group of L7 cells are to have their program voltages determined for the L8 level), then, a second correlation is performed from the single verification process for the cells of the third group that "bumps-up" their program voltages from the verification even more than what cells from the second group are bumped-up to. Again, the bump-up may be a single increment, a scaled number of increments depending on cell strength, or a continuous bump-up.

Figure 4:
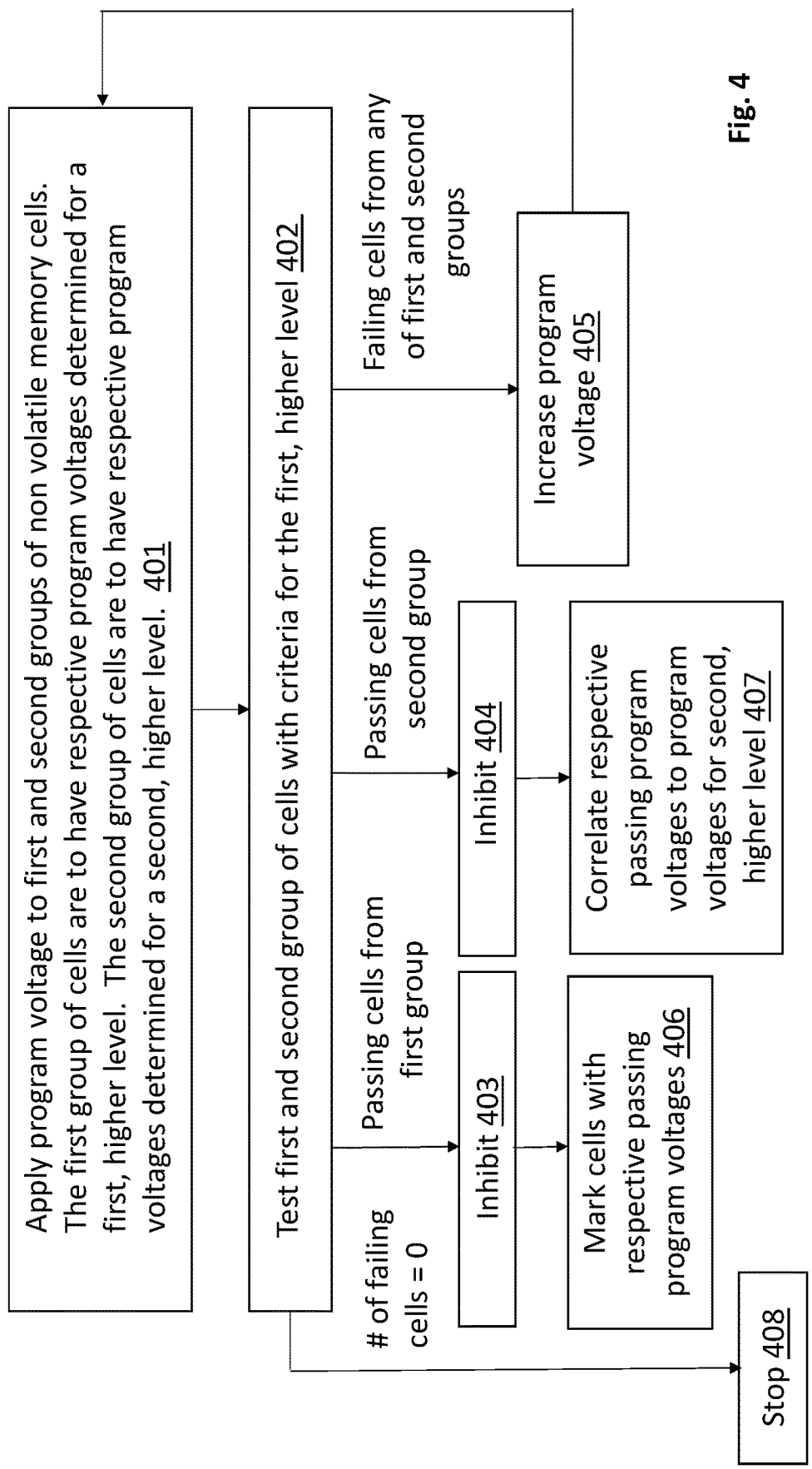
FIG. 4 shows a flow diagram of the improved program-verify process of FIG. 3.

FIG. 4 shows a methodology described above. A program voltage is applied to first and second groups of non volatile memory cells 401. The first group of cells are to have respective program voltages determined for a first, higher level. The second group of cells are to have respective program voltages determined for a second, higher level. The first and second group of cells are tested with criteria for the first, higher level 402. Cells from the first and second groups that pass the criteria are marked as pass and are inhibited 403, 404. Cells from the first and second groups that fail the criteria are subjected to another iteration with a higher program voltage 405. The passing cells from the first group are marked to be programmed with the respective program voltage that resulted in a pass 406. The cells from the second group are marked to be programmed with a program voltage that is correlated to the respective program voltage that resulted in a pass 407. The process continues until all cells pass 408.

Figure 5:
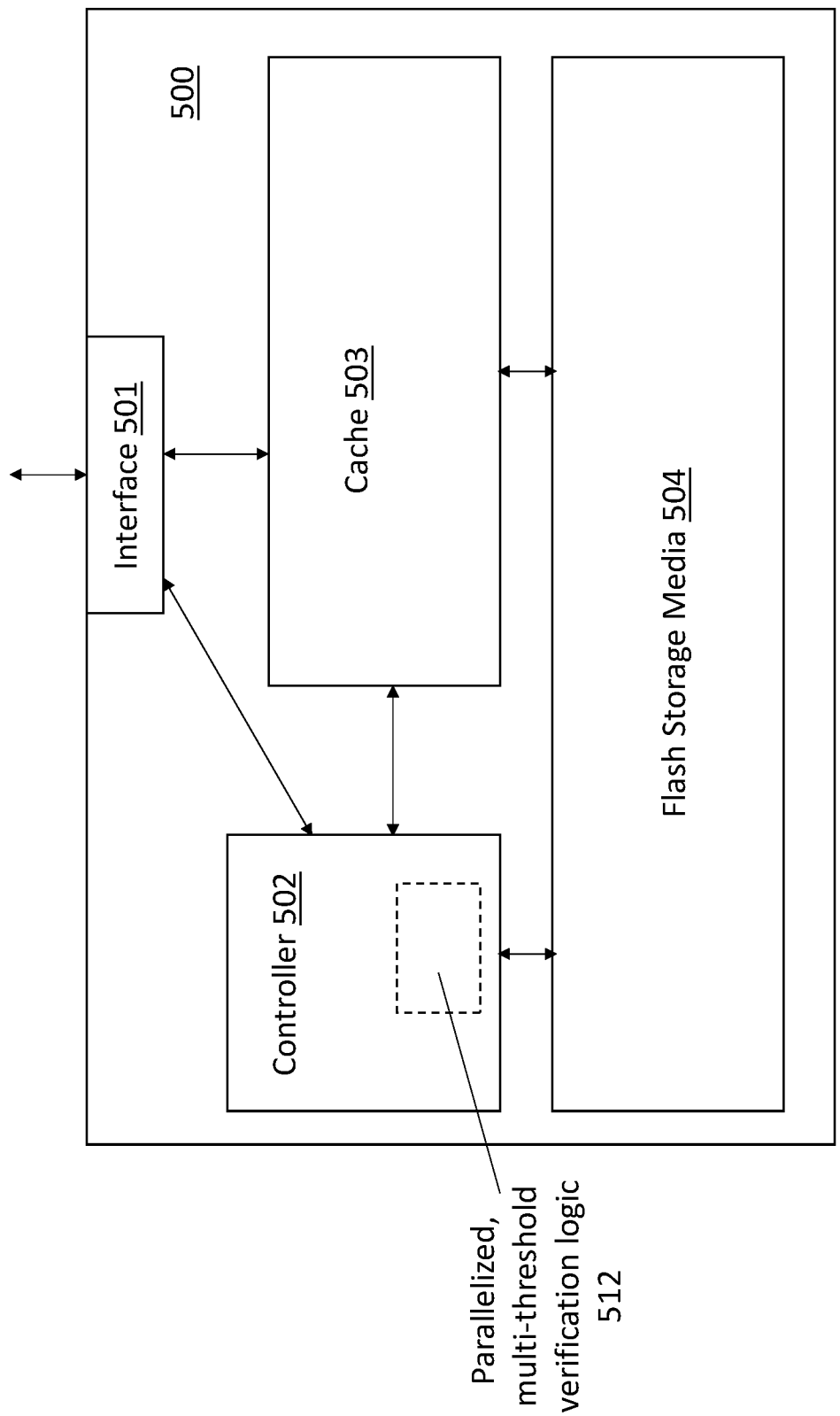
FIG. 5 shows an SSD that can perform the improved program-verify process of FIG. 3.

FIG. 5 shows a depiction of an SSD 500. As observed in FIG. 5, the SSD includes a host interface 501, a controller 502, a cache 503 and flash storage media 504. The interface 501 can be any host to peripheral or storage device interface (e.g., peripheral component interface express (PCIe), non volatile memory express (NVMe), etc.) or network interface. The controller 502 controls over all operation of the SSD 500. The cache 503 is typically composed of dynamic random access memory (DRAM) to improve the overall speed of the SSD 500 as observed by the host or other user of the SSD 500. The flash storage media 504 is typically composed of multiple flash memory chips.

Here, the controller 502 is various implementations is designed to implement the improved, parallelized program verification process as described at length above. The controller 502 and/or logic 512 used to implement the improved program verification process may be implemented with logic circuitry such as dedicated (hardwired) application specific logic circuitry (e.g., ASIC logic circuitry), programmable logic circuitry (e.g., field programmable gate array (FPGA) logic circuitry), logic circuitry that executes some form of program code (e.g., an embedded processor or controller that executes SSD firmware). Although not shown, the controller 502 may be coupled to or include a charge pump circuit that creates the appropriate program voltages of the word lines of the SSD's storage cells for particular threshold levels.

Although the above described the controller that performs the parallelized program verification as being separate from the flash memory chips in an SSD, conceivably, such a controller could be embedded within a flash memory chip for, e.g., (partially or wholly) distributed parallelized program verification with an SSD, e.g., other storage device or system that uses flash memory.

Figure 6:
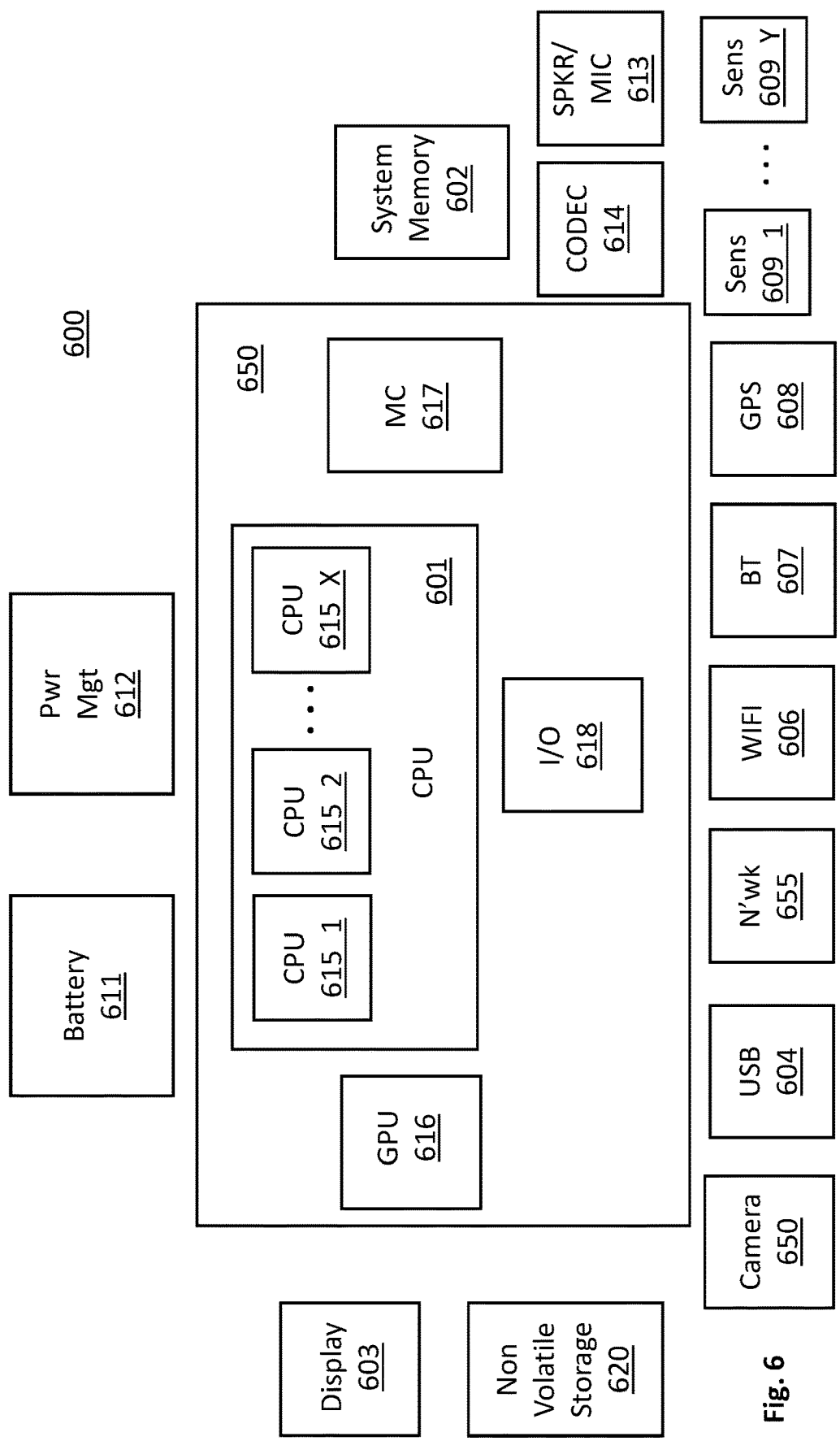
FIG. 6 shows a computing system.

FIG. 6 provides an exemplary depiction of a computing system 600 (e.g., a smartphone, a tablet computer, a laptop computer, a desktop computer, a server computer, etc.). As observed in FIG. 6, the basic computing system 600 may include a central processing unit 601 (which may include, e.g., a plurality of general purpose processing cores 615_1 through 615_X) and a main memory controller 617 disposed on a multi-core processor or applications processor, system memory 602, a display 603 (e.g., touchscreen, flat-panel), a local wired point-to-point link (e.g., USB) interface 604, various network I/O functions 605 (such as an Ethernet interface and/or cellular modem subsystem), a wireless local area network (e.g., WiFi) interface 606, a wireless point-to-point link (e.g., Bluetooth) interface 607 and a Global Positioning System interface 608, various sensors 609_1 through 609_Y, one or more cameras 610, a battery 611, a power management control unit 612, a speaker and microphone 613 and an audio coder/decoder 614.

An applications processor or multi-core processor 650 may include one or more general purpose processing cores 615 within its CPU 601, one or more graphical processing units 616, a memory management function 617 (e.g., a memory controller) and an I/O control function 618. The general purpose processing cores 615 typically execute the operating system and application software of the computing system. The graphics processing unit 616 typically executes graphics intensive functions to, e.g., generate graphics information that is presented on the display 603. The memory control function 617 interfaces with the system memory 602 to write/read data to/from system memory 602. The power management control unit 612 generally controls the power consumption of the system 600.

Each of the touchscreen display 603, the communication interfaces 604-607, the GPS interface 608, the sensors 609, the camera(s) 610, and the speaker/microphone codec 613, 614 all can be viewed as various forms of I/O (input and/or output) relative to the overall computing system including, where appropriate, an integrated peripheral device as well (e.g., the one or more cameras 610). Depending on implementation, various ones of these I/O components may be integrated on the applications processor/multi-core processor 650 or may be located off the die or outside the package of the applications processor/multi-core processor 650. The computing system also includes non-volatile mass storage 620 which may be the mass storage component of the system which may be composed of one or more non-volatile mass storage devices (e.g. hard disk drive, solid state drive, etc.). The non-volatile mass storage 620 may be implemented with an SSD having a parallelized, multi-level program-verification process as described at length above.

Embodiments of the invention may include various processes as set forth above. The processes may be embodied in machine-executable instructions. The instructions can be used to cause a general-purpose or special-purpose processor to perform certain processes. Alternatively, these processes may be performed by specific/custom hardware components that contain hard interconnected logic circuitry or programmable logic circuitry (e.g., field programmable gate array (FPGA), programmable logic device (PLD)) for performing the processes, or by any combination of programmed computer components and custom hardware components.

Elements of the present invention may also be provided as a machine-readable medium for storing the machine-executable instructions. The machine-readable medium may include, but is not limited to, floppy diskettes, optical disks, CD-ROMs, and magneto-optical disks, FLASH memory, ROMs, RAMs, EPROMs, EEPROMs, magnetic or optical cards, propagation media or other type of media/machine-readable medium suitable for storing electronic instructions. For example, the present invention may be downloaded as a computer program which may be transferred from a remote computer (e.g., a server) to a requesting computer (e.g., a client) by way of data signals embodied in a carrier wave or other propagation medium via a communication link (e.g., a modem or network connection).

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

The invention claimed is:

1. An apparatus, comprising:
a storage device controller comprising logic circuitry to apply a program voltage verification process for a first threshold level to a group of non volatile memory cells and correlate first program voltages for the group of non volatile memory cells determined from the process to a second threshold level to determine second program voltages for the second threshold level for the group of non volatile memory cells, wherein, the second threshold level is higher than the first threshold level.

2. The apparatus of claim 1 wherein the logic circuitry is also to apply the program voltage verification process for the first threshold level to another group of non volatile memory cells, wherein third program voltages determined from the process for the other group of non volatile memory are used to program the other group of non volatile memory cells from the first threshold level.

3. The apparatus of claim 2 wherein the process includes applying a same word line voltage to the group of non volatile memory cells and the other group of non volatile memory cells.

4. The apparatus of claim 2 wherein the process includes applying a same pass/fail test voltage to the group of non volatile memory cells and the other group of non volatile memory cells.

5. The apparatus of claim 2 wherein the logic circuitry is also to apply the program voltage verification process for the first threshold level to a third group of non volatile memory cells and correlate fourth program voltages for the third group of non volatile memory cells determined from the process to a third threshold level to determine fifth program voltages for the third threshold level for the third group of non volatile memory cells, wherein, the third threshold level is higher than the second threshold level.

6. The apparatus of claim 1 wherein the correlation is to add a fixed voltage amount to at least one of the first program voltages to determine a corresponding one of the second program voltages.

7. The apparatus of claim 1 wherein the correlation is to add different voltage amounts to certain ones of the first program voltages based on memory cell strength to determine corresponding ones of the second program voltages.

8. A computing system, comprising:
one or more processing cores;
a system memory;
a memory controller disposed between the system memory and the one or more processing cores;
a network interface;
a mass storage device comprising a controller, the controller comprising logic circuitry to apply a program voltage verification process for a first threshold level to a group of non volatile memory cells and correlate first program voltages for the group of non volatile memory cells determined from the process to a second threshold level to determine second program voltages for the second threshold level for the group of non volatile memory cells, wherein, the second threshold level is higher than the first threshold level.

9. The computing system of claim 8 wherein the logic circuitry is also to apply the program voltage verification process for the first threshold level to another group of non volatile memory cells, wherein third program voltages determined from the process for the other group of non volatile memory cells are used to program the other group of non volatile memory cells from the first threshold level.

10. The computing system of claim 9 wherein the process includes applying a same word line voltage to the group of non volatile memory cells and the other group of non volatile memory cells.

11. The computing system of claim 9 wherein the process includes applying a same pass/fail test voltage to the group of non volatile memory cells and the other group of non volatile memory cells.

12. The computing system of claim 9 wherein the logic circuitry is also to apply the program voltage verification process for the first threshold level to a third group of non volatile memory cells and correlate fourth program voltages for the third group of non volatile memory cells determined from the process to a third threshold level to determine fifth program voltages for the third threshold level for the third group of non volatile memory cells, wherein, the third threshold level is higher than the second threshold level.

13. The computing system of claim 8 wherein the correlation is to add a fixed voltage amount to at least one of the first program voltages to determine a corresponding one of the second program voltages.

14. The computing system of claim 8 wherein the correlation is to add different voltage amounts to certain ones of the first program voltages based on memory cell strength to determine corresponding ones of the second program voltages.

15. A method, comprising:
applying a program voltage verify process to both a first and second group of non volatile memory cells;
establishing program voltages of the program voltage verify process as appropriate program voltages for the first group of non volatile memory cells for a first threshold level;
determining appropriate program voltages for the second group of non volatile memory cells for a second threshold level by correlating to program voltages of the program voltage verify process that were applied to the second group of non volatile memory cells.

16. The method of claim 15 wherein the program voltage verification process applies a same word line voltage to both the first and second group of non volatile memory cells.

17. The method of claim 15 wherein the program voltage verification process applies a same pass/fail test voltage to both the first and second group of non volatile memory cells.

18. The method of claim 15 wherein the correlating comprises adding a fixed voltage amount to the program voltages of the program voltage verify process applied to the second group of non memory cells.

19. The method of claim 15 wherein the correlating comprises adding different voltage amounts to the program voltages of the program voltage verify process applied to the second group of non memory cells based on memory cell strength.

20. The method of claim 15 wherein the method further comprises:
applying the program voltage verify process to a third group of non volatile memory cells along with the first and second group of non volatile memory cells;
determining appropriate program voltages for the third group of non volatile memory cells for a third threshold level by correlating to program voltages of the program voltage verify process that were applied to the third group of non volatile memory cells.

* * * * *